United States Patent [19]

Bachmann et al.

[11] 4,287,527

[45] Sep. 1, 1981

[54] OPTO-ELECTRONIC DEVICES BASED ON BULK CRYSTALS OF COMPLEX SEMICONDUCTORS

[75] Inventors: Klaus J. Bachmann, Piscataway, N.J.; Charles T. Ryan, Fishkill, N.Y.

[73] Assignee: Bell Telephone Laboratories, Incorporated, Murray Hill, N.J.

[21] Appl. No.: 73,206

[22] Filed: Sep. 7, 1979

Related U.S. Application Data

[63] Continuation of Ser. No. 937,950, Aug. 30, 1978, abandoned.

[51] Int. Cl.$^3$ .......................................... H01L 27/14
[52] U.S. Cl. ........................................ 357/30; 357/15; 357/61
[58] Field of Search .................... 357/30, 15, 17, 61

[56] References Cited

U.S. PATENT DOCUMENTS

4,075,651  2/1978  James ........................................ 357/22
4,213,138  7/1980  Campbell et al. ....................... 357/30

OTHER PUBLICATIONS

*Journ. of Appl. Phys.*, vol. 43, No. 8, Aug. 1972, pp. 3533–3537.
*Journ. of Appl. Phys.*, vol. 44, No. 3, Mar. 1973, pp. 1333–1341.
*Soviet Physics–Solid State*, vol. 8, No. 4, Oct. 1966, pp. 1025–1026.

*Primary Examiner*—Martin H. Edlow
*Attorney, Agent, or Firm*—Bruce S. Schneider

[57] ABSTRACT

Opto-electronic devices such as photodetectors have been made based on bulk crystals of $Ga_xIn_{1-x}P_yAs_{1-y}$. These bulk crystals have high purity, e.g., less than $10^{16}$ carriers/cm$^3$ and low defect densities, e.g., less than $10^6$ cm$^{-2}$. The properties of these crystals lead to photodetectors with good quantum efficiencies.

4 Claims, 6 Drawing Figures

OPTO-ELECTRONIC DEVICES BASED ON BULK CRYSTALS OF COMPLEX SEMICONDUCTORS

This is a continuation of application Ser. No. 937,950, filed Aug. 30, 1978, abandoned.

BACKGROUND OF THE INVENTION

1. Field of the Invention

This invention relates to bulk semiconductor devices and, more particularly, to opto-electronic devices grown on bulk crystals.

2. Art Background

Photodetectors having wavelength responses tailored to specific frequencies in the infrared are becoming important for applications such as optical communications. Bandgaps of the absorbing semiconductor material in this photodetector must have an energy bandgap sufficiently small to provide a response in this low energy region of the spectrum. Ternary and quaternary semiconductors are being investigated for this purpose since the composition of these compounds can be varied to produce a wide range of bandgaps. A combination of two binary semiconductors, at least in theory, can be used to produce bandgaps between those of the constituent binary semiconductors. The III-V compounds, in this regard, are attractive since they have bandgaps in the desired infrared region for optical communications. For example, binary materials such as InP or InAs have been combined to make epitaxial ternary layers of $InP_yAs_{1-y}$, which, depending on the value of y, have a bandgap between 0.36 eV and 1.34 eV at room temperature.

For many photovoltaic applications, including photodetection, it is desirable to use single crystal devices, i.e., devices which are built on a single crystal semiconductor material which has a low defect density, (typically less than $10^6$ cm$^{-2}$) and which is of high purity, i.e., typically having less than $10^{16}$ carriers/cm$^3$ in nominally undoped crystals. Such single crystal devices, including those based on III-V compounds, generally have much better quantum efficiencies than their polycrystalline counterparts. These higher efficiencies are desirable for applications where a small area device is used to detect low intensity radiation.

Two types of single crystal devices are the most prevalent. The first is built upon an epitaxial layer (typically 1–10 μm thick) of semiconductor material deposited on a single crystal substrate of different composition. In this configuration, the substrate must be matched to the underlying epitaxial layer so that good electrical properties, approaching those of bulk crystalline material, are achieved in the epitaxial layer. This, at the very least, requires matching the lattice parameters of the device semiconductor to that of the substrate.

In ternary semiconductors, when the composition is adjusted to give the appropriate lattice constant for a given substrate, there is no further possibility of adjusting composition to form a desired bandgap. Therefore, an epitaxial single crystal device, grown on bulk single crystal substrates of a binary or elemental semiconductor, generally cannot be tailored to operate at a desired wavelength. In a quaternary alloy, which has one greater degree of compositional freedom than the ternary, lattice matching and bandgap tailoring is possible for an epitaxial device using certain binary substrates. (See *J. Electron. Mater.*, 6, 253 (1977).) However, in practice, controlling the composition to obtain precise lattice matching is difficult. Additionally, other parameters such as dopant levels must also be controlled during epitaxy of a quaternary compound. Because of these extensive control complications, it is generally difficult to obtain reproducible results for quaternary epitaxial layers.

In a second type of single crystal structure, devices such as Schottky barriers, heterodiodes or homodiodes, built on bulk crystals (crystals having dimensions greater than 5 mm) of a semiconductor or wafers cut from such crystals have advantages over their corresponding epitaxial entity. Since the device is built directly on the bulk crystal of an active semiconductor, i.e., a semiconductor used to form the rectifying interface, lattice matching is not a problem. This extra degree of freedom results in the possibility of producing a chosen bandgap in ternary devices and relieves the control problems associated with quaternary devices. Other fabrication problems are also markedly reduced. For example, once the bulk crystal is formed, devices with reproducible physical dimensions can be produced merely by slicing wafers from the bulk crystal body.

Although bulk crystals have inherent advantages, their growth is not a trivial problem. Bulk crystals with high defect densities which are not satisfactory for device utilization are often produced. The formation of high quality single crystal materials, i.e., materials having less than $10^6$ cm$^{-2}$ defects as measured by methods such as etchpit and x-ray techniques (*Thin Solid Films*, 31, 185 (1976); ibid, 31, 253 (1976); *J. Appl. Phys.*, 36, 2855 (1965); *J. Electrochem. Soc.* 107, 433 (1960)), is often not achievable. For example, ternary III-V systems typically have large gaps between their liquidus and solidus over their entire compositional range. This property generally produces both radial and axial compositional variations in crystals grown from the melt. Both such gradients lead to poor reproducibility and often to inoperative devices. The radial variations are particularly unacceptable since wafers are typically cut perpendicular to the growth direction of the crystal. This method of cutting, in radially defective crystals, yields unacceptable gradients across the surface of the semiconductor material upon which the device is built. For quaternary compounds, the solidus-liquidus gap is usually even more unfavorable. Thus, the probability of making a single crystal bulk quaternary device with reproducible characteristics is even smaller.

As discussed earlier, ternary or quaternary materials composed of III-V compounds have potentially desirable properties. Nevertheless, the ternary liquidus-solidus gap is generally quite large. (See M. B. Panish and M. Ilegems, "Phase Equilibria in Ternary III-V Systems", Vol. 7, *Progr. Solid State Chem.* (Ed. H. Reiss and J. McCaldin), N.Y. 1972 pp. 38–83). This fact seems to preclude the manufacture of useful bulk crystal devices from these materials.

SUMMARY OF THE INVENTION

Devices are built on bulk crystals of $Ga_xIn_{1-x}P_yAs_{1-y}$, where $0 \leq x \leq 0.5$ and $0 < y < 1$, having defect densities less than $10^6$ cm$^{-2}$. Devices are made on wafers of the $InP_yAs_{1-y}$ ternary embodiment and the quaternary embodiment. For example, Schottky barriers made on $In_{0.9}Ga_{0.1}As_{0.27}P_{0.73}$, using a platinum conductive layer, yield quantum efficiencies of 40% measured at 0.8 μm. Similar detectors with slightly lower efficiencies, 20–40%, operating in the wavelength range between 0.6 and 1.4 μm have been made. Other detectors, which are made by diffusing a conductivity-type-converting dopant into the bulk crystal to generate homodiodes have comparable response properties.

DETAILED DESCRIPTION

The inventive devices are all based on bulk crystals of $Ga_xIn_{1-x}P_yAs_{1-y}$. The particular form of the device which is built upon these crystals is not critical. For example, Schottky barriers, heterodiodes ad homodiodes are possible. As a pedagogic aid, the devices in the remainder of the specification will be described as formed from a bulk crystal and an interfacing material layer. This interfacing material layer is a highly conductive material for Schottky barriers, a semiconductor material of different composition in the heterodiode situation and usually an indiffused area within the bulk crystal itself of opposite majority carrier type for homodiode applications. Although, strictly in the latter case, there is no new interfacing material, the term is being used as a generic classification and refers to the area forming the rectifying junction with the portion of the bulk crystal having the initial conductivity type.

Figure 1:
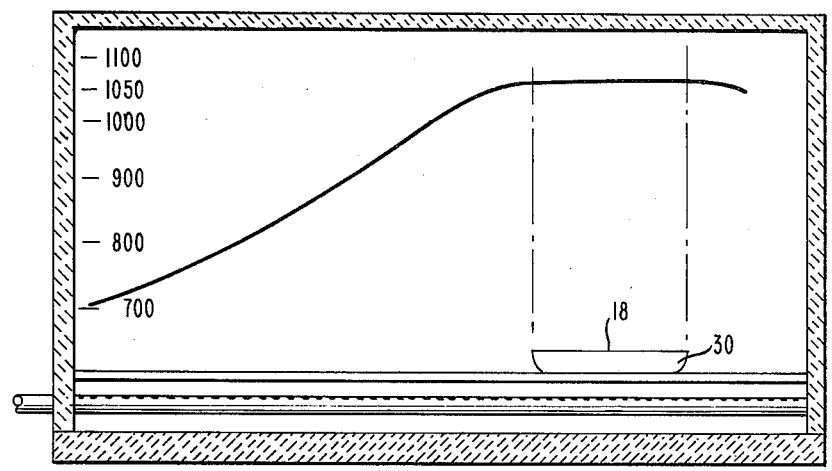

As discussed, one advantage of the inventive device is that they are formed directly on an active area of the diode, i.e., the bulk crystal of $Ga_xIn_{1-x}P_yAs_{1-y}$. The formation of this bulk crystal requires specific processing conditions. Conditions must be adjusted to compensate for the difficulty associated with a large liquidus-solidus gap. For $InP_yAs_{1-y}$, this is done by carefully controlling the conditions of a gradual growth process such as the gradient freeze technique. In this technique, for the subject complex compounds, a furnace having the temperature distribution shown in FIG. 1 is used. An inert boat, e.g., $SiO_2$, BN or carbon, containing an appropriate mixture of InAs and InP to produce the desired compound semiconductor is sealed in an evacuated fused silica ampule and is placed in the furnace at the position indicated in FIG. 1. (For clarity the ampule is not shown.) Additionally, elemental phosphorus and elemental arsenic are added inside the capsule, but outside the boat, to insure that the atmosphere within the reaction chamber has a reservoir of these elements. It has been found that this excess is beneficial in avoiding the problems associated with composition gradients in As or P content. The excess of phosphorus and arsenic over the desired compound proportions depends on the size of the reaction vessel but generally should be enough at nominal processing temperatures to produce less than 0.4 atms., $As_2$ vapor, and less than 27.5 atms. $P_4$ vapor. Preferably approximately 0.1 to 0.3 atms. $As_2$, and 10-20 atms. $P_4$ are used in the preferred composition range of $0.4 \lesssim y \lesssim 0.6$. For composition outside this range a corresponding increase or decrease in P/As vapor pressure is necessary. The mixture of reactants are then heated above the melting point of the highest melting constituent of the mixture. This heating process must be carefully done to avoid an explosion. Generally, a heating period of a number of days, e.g., 2 to 5 days, is required for safety purposes.

The melt is maintained at the chosen temperature for a sufficiently long time to insure homogeneity of the liquid body. This period is generally from 12 to 70 hours. The melt is then slowly cooled to a temperature at which the entire reaction mass has solidified and at which thermal shock upon quenching is negligible. This temperature for $InP_yAs_{1-y}$ is in the range between 800 and 500 degrees C. The time period for cooling from the melt condition to the solid condition is important. Rapid cooling during solidification results in highly strained, highly defective crystals (usually having polycrystalline morphology) while extremely slow cooling is uneconomical for most commercial applications. Linearly decreasing the temperature for periods from 3 to 10 days is usually suitable.

The crystal is doped by substituting sufficient doped InP into the initial reaction mixture to produce the desired majority carrier concentration in the final crystal. (Doping could be introduced using doped InAs, but since the InP melts after the InAs, the previous method mitigates the amount of dopant lost through evaporation.) For example, if p-type doping is desired, a portion of zinc or cadmium doped InP is utilized and if n-type doping is required a Sn doped portion is employed. The amount of dopant, and thus the carrier concentration used, varies with the ultimate application. However, for most purposes, majority carrier concentrations in the bulk crystal in the range $10^{16}$ to $10^{18}$ cm$^{-3}$ are suitable.

The ternary crystal obtained by using the gradient freeze technique have excellent quality. The free electron concentration in nominally undoped material is comparable to that achieved in bulk single crystals of the binary III-V compounds, i.e., $10^{15}$ to $10^{16}$ cm$^{-3}$, corresponding to narrow photoluminescence peaks (100-200 A halfwidths). Typically the defect concentration is less than $10^6$ cm$^{-2}$ when measured by the etchpit method. Therefore, further processing of the bulk crystal is usually unnecessary for production of devices with desirable quantum efficiencies. Nevertheless, the defect density is further diminished if additional process treatments, e.g., zone leveling, are performed before the device is finally fabricated.

The growth of $Ga_xIn_{1-x}P_yAs_{1-y}$ where x and $y > 0$ but less than 1 also must be carefully controlled to produce low defect bulk crystals. Indeed, because more constituents are involved than in the ternary embodiment, even closer control of the processing parameters are necessary.

Figure 2:
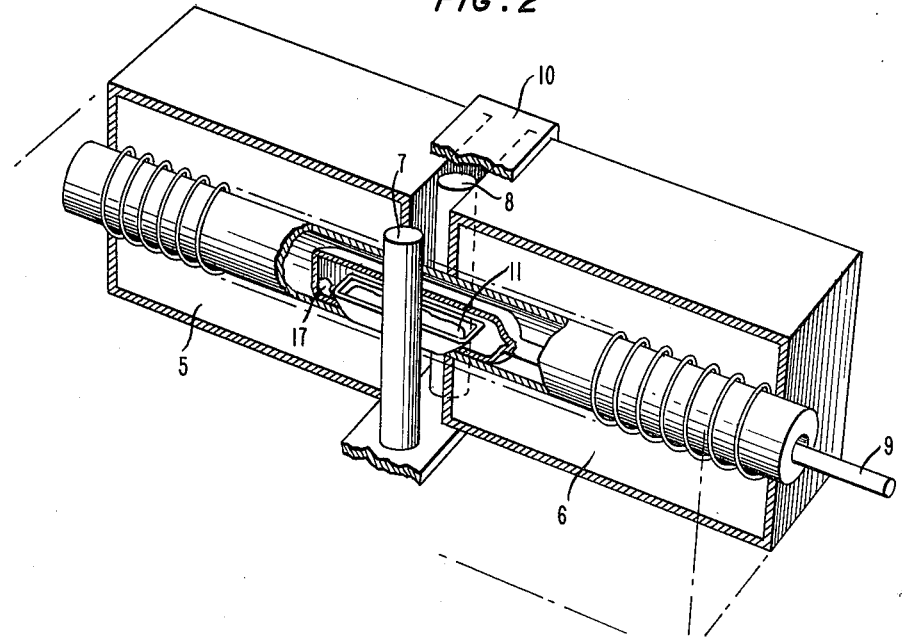

For convenience, the quaternary compounds of the invention are formed in a reactor having fused silica walls. The melting point of the compound increases strongly with Ga and with P concentration. The vapor pressure of the melt also influences the processing temperatures utilized. When the convenience of using a silica reactor is desired, As rich melts, i.e., $y < 0.1$, require x to be chosen to give an alloy melting temperature of $< 1250$ degrees C., while for P-rich melts, $y > 0.5$, x is chosen to give an alloy melting temperature $< 1100$ degrees C. It is possible to prepare alloys in other compositional ranges but this requires the use of other materials for the reactor walls or use of a pressure system to prevent sagging of the silica walls. Additionally, precautions must be taken to avoid excessive concentration variations of the phosphorus and arsenic contained in the melt. These excessive variations caused by the preferential segregation of phosphorus during solidification result not only in unacceptable concentration gradients in the solid, but also in reproducibility difficulties. The quaternary crystals are initially made basically as described in the $InP_yAs_{1-y}$ embodiment. The desired proportions of In and Ga are combined as an alloy of these two metals with elemental phosphorus and elemental arsenic in an inert boat. Alternatively the desired proportions of InAs, GaAs, and InP are combined in an inert boat. (For arsenic rich alloys, a boron nitride boat is not inert to the reaction mixture compounds. Boats composed of materials such as fused silica or vitreous carbon are used in this case.) The boat is then sealed in an evacuated fused silica ampule containing excess phosphorus and arsenic to establish the required vapor pressure as specified earlier for the ternary embodiment and the entire mixture is slowly heated to produce a melt. Temperatures in the range 1000 to 1200 degrees C., achieved over a heating period of 2 to 3 days, are adequate for producing this melt. Cooling is then initiated at a rate between 5 and 84 degrees/hr. until a temperature in the range 800 to 900 degrees C. is obtained. Again this slow cooling process is important if excessive composition gradients or defect densities are to be avoided. The resulting crystal typically has defect densities in the range $10^5$ to $10^7$ cm$^{-2}$. Areas in the ingot of several mm$^2$ are produced which have defect densities below $10^6$/cm$^2$. A second processing step is then necessary to reduce the defects and composition gradients to an acceptable level or to further improve the defect level. For example, to counteract the defects occurring from the gradient freeze process, a zone melting procedure is suitable as the second processing step. In a preferred embodiment, an apparatus as shown in FIG. 2 is utilized. The crystal is inserted into the melt region which consists of two furnaces, 5, and 6 and a pair of glow bars, 7 and 8, positioned perpendicularly to the growth axis of the crystal. The glow bars are located so that they straddle the last to freeze end (i.e., the portion of the crystal in boat 30 of FIG. 1 denoted by 18) of the previously synthesized quaternary crystal. The furnaces are then heated to a temperature below the melting point of the compound, typically between 800 and 900 degrees C. The temperature of the glow bars are adjusted to form a melted region having a width of typically between 0.5 and 1.5 cm for a 12.5 cm long boat of 2 cm diameter used in the gradient freeze process. If longer boats are used, it is possible to employ zone lengths which are larger. The initial zone is established on the last to freeze end of the ingot. The glow bars are then moved along the ingot to slowly melt new areas of the crystal body. The rate of movement must be sufficiently slow to insure that solidification in the interval previously melted occurs before an interval larger than the original melted region is liquefied. This rate depends on the composition of the ingot, and is typically in the range 0.1 mm/hr. to 3 mm/hr. This process yields crystals having defect densities in the range $10^4$ to $10^6$ cm$^{-2}$.

Alternatively, a zone leveling procedure is used. The initial synthesis of the compound is performed in the same manner as previously described. However, the crystal, after synthesis, is broken into small pieces and placed in an inert boat. When a crystal of average composition of $Ga_xIn_{1-x}P_yAs_{1-y}$ is to be processed a piece of average composition $Ga_zIn_{1-z}P_yAs_{1-y}$ (where $z = x/k_{Ga}$ and $k_{Ga}$ is the effective distribution coefficient of Ga) is placed at one end of the boat adjoining the crushed $Ga_xIn_{1-x}P_yAs_{1-y}$. (See W. G. Pfann, *Zone Melting*, 2nd Ed. Wiley (1966).) The value of $k_{Ga}$ depends on the composition of the crushed complex compound. For the purpose of zone leveling used for processing the subject bulk crystals, a value of approximately 10 is generally satisfactory. The mixture of average composition $Ga_zIn_{1-z}P_yAs_{1-y}$ is prepared by making a physical mixture of ternary $InAs_{1-y-z}P_y$ and GaAs in the appropriate proportions.

The boat is sealed in an evacuated ampule. Before sealing the ampule, an excess of P and As is placed into the ampule. These elements are added to provide an $As_2$, $P_2$, and $P_4$ vapor atmosphere. The entire body is then placed in an apparatus as shown in FIG. 2 with the glow bars straddling the material having composition $Ga_zIn_{1-z}P_yAs_{1-y}$. The furnace is heated to a temperature below the melting point of the compounds in the boat. Both furnaces, 5, and 6, are used at the same temperature, usually 800 to 900 degrees C. However, if a solid P source which is to be vaporized is used to provide the $P_2$ and $P_4$ atmosphere, only one furnace, 6, in FIG. 2, is heated to about 800 to 900 degrees C., while the other is kept at about 500 to 550 degrees C. This latter temperature is also picked so that the excess phosphorus, 17, placed in the ampule slowly evaporates to maintain $P_2$ and $P_4$ in the vapor phase. The glow bars are initially heated to melt the section of $Ga_zIn_{1-z}P_yAs_{1-y}$ and moved to successively melt regions as described in the zone melting procedure. Generally, the glow bar temperatures are raised until the desired zone size, as described for the zone melting procedure, is visually observed. The glow bars and furnaces are moved at a rate as described previously in the zone melting section. Through the use of zone leveling, defect densities less than $10^6$ cm$^{-2}$ are obtainable.

Once the bulk crystal is obtained, it is possible to build a device onto the bulk crystal itself or onto a wafer cut from it. (For convenience the wafer for purposes of this disclosure is also considered to be included within the definition of a bulk crystal. Additionally it is possible by conventional techniques to grow a homo-epilayer onto the bulk crystal, i.e., epilayers having the same composition and majority carrier type as the bulk crystal. A homojunction, heterojunction, or Schottky barriers is then built on this epilayer. This type construction allows choice of bandgap without lattice matching problems while affording the advantages of an epilayer such as possibility of controlled grading of the majority carrier concentration in a small spacial region. Again for convenience of this disclosure the entire entity of the homo-epilayer on the initial single crystal substrate is defined as a bulk crystal.) The bulk crystal is usually cut in wafers, typically of cross-sectional area ½ to 1 cm$^2$ and thickness 0.5 mm, for formation of a rectifying device. For manufacture of Schottky barriers, a large number of satisfactory methods are available for depositing a conductive metal on the wafer. It has been found expedient, simply to evaporate or sputter a highly conductive material, for example, gold or platinum onto the major surface of the crystal. Contacts are then made to this highly conducting material by conventional techniques such as evaporation of aluminum and to the uncoated surface of the bulk crystal wafer by conventional techniques such as evaporating, or electroplating, a mixture such as Au-Zn onto a portion of the highly conductive material and sintering the mixture.

Homodiodes are expediently formed by diffusing an appropriate dopant into the wafer. For wafers with n-type doping a p-type dopant such as Zn is used. Similarly, for p-type doping in the wafer n-type dopants such as S are employed. Diffusion depths of 500 Å to 50 $\mu$m, preferably 3000 Å to 1 $\mu$m are desirable. Shallower diffusion is not preferred because surface recombinations and sheet resistance problems become unacceptably high. Deeper diffusion is also not preferred because insufficient carrier collection results.

Diffusion techniques are advantageously used if a homodiode is to be made. A preferred method of performing the diffusion is to heating the wafer which can be capped in a sealed evacuated ampule containing a volatile dopant source such as $ZnAs_2$. (Capping is useful for preventing surface erosion. If the wafer is to be capped, it is covered with a layer of a compound such as silicon dioxide having a thickness of about 400 Å by sputtering.) The temperature and the period used for the diffusion determines the depth of the diffusion. In general, for the bulk crystals of this invention, temperatures between 500 and 650 degrees C. (700 degrees C. for a capped wafer) and heating time periods in the range 10 min. to 10 hrs. are used. The two parameters are interdependent and a control sample must be used to determine the exact combination of the temperature and heating time to produce the desired diffusion depth. For example, for an uncapped crystal an $18\mu$ diffusion depth is obtained when using a Zn dopant with a 2 hour diffusion at 600 degrees C. A half an hour diffusion at 550 degrees C gives a $2.5\mu$ junction depth.

Contacts to the indiffused layer and to the original non-diffused area are made by conventional techniques such as electroplating and then sintering Au-Zn onto the indiffused area and Au-Sn into the non-diffused area.

Both Schottky barriers and homodiodes made in this manner exhibit good quantum efficiencies in the infrared region between 800 and 1400 nm. Quantum efficiencies up to 40% are obtainable.

EXAMPLE 1

Approximately 32.948 grams of InAs, 42.72 grams nominally undoped InP and 7.483 grams of Zn doped InP with a majority carrier concentration of $3 \times 10^{18}$ $cm^3$ were loaded into a 5 inch long boron nitride boat. This boat was placed in a fused silica ampule, containing 1.722 grams P, and 0.104 grams As, the ampule was evacuated, and then sealed. The ampule was placed in a furnace having a temperature profile shown in FIG. 1 at the position indicated in that figure. The furnace was then heated at a linear rate until the hottest point in the furnace was at a temperature of approximately 1070 degrees C. (approximately three days). The furnace was then maintained at this temperature for a period of approximately 67 hours. Then the temperature was linearly decreased at a rate of approximately 84 degrees C. per/hr. until a temperature of about 775 degrees C. was reached. The furnace was shut down and the ampule with its boat were allowed to cool in the furnace. When the furnace reached room temperature the ampule was removed and broken. The contents of the boat included a single crystal of $InAs_{0.33}P_{0.67}$ having dimensions of approximately 43 mm. by 20 mm. $\times$ 11 mm. The majority carrier concentration of this crystal was approximately $3.5 \times 10^{17}$ $cm^{-3}$ and the mobility as measured by the Hall method was 55 $cm^2$/volt seconds.

Figure 3:
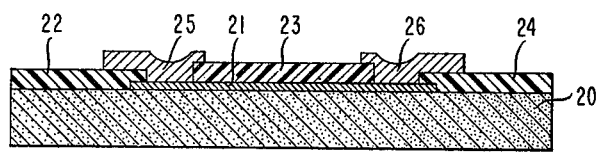

The crystal was oriented along the (111) plane by the Laue x-ray technique. Wafers with a 20 mil. thickness were then sliced parallel to this plane with a diamond saw. The major faces of these wafers were lapped with 305 $Al_2O_3$ (50 $\mu m$ grain size) and polished with Nalcoag 1060, an alkaline silica suspension having an average particle size of about 50 to 70 $m\mu$ and a pH of about 8.5. The defect density of the wafers as measured by the etchpit method was approximately $3 \times 10^5$ $cm^{-2}$. An Au-Zn alloy (composition about 2% Zn) was electroplated by conventional techniques onto one of the major surfaces of the wafer. The current density and solution used in this electroplating process were respectively about 10 $ma/cm^2$ and 100 ml. water, 30 gm. zinc chloride, 16 gm. potassium chloride with sufficient HCl to adjust the solution to a pH between 3 and 4. The wafer was then sintered at a temperature of about 450-500 degrees C. to form an ohmic contact. The uncoated side was treated with a bromine/methanol (composition 5%) and was cleaned in trichloroethylene, acetone and methanol. A AZ1350J photoresist (a Shipley proprietary product) was then applied to the wafer, 20 in FIG. 3. Many $300\mu$ diameter holes were then formed in the resist by photomasking and development by using the Shipley proprietary developer for this resist. A platinum film, 21, which was approximately 100 Å thick, as estimated by optical transmission measurements, was sputtered on the resist coating side of the wafer. The sputtering was done in an ion beam sputtering apparatus using conditions of a beam current of 0.4 $ma/cm^2$, an accelerating potential of about 600 Volts, and an Ar pressure of between about $1.5 \times 10^{-3}$ and $3.4 \times 10^{-2}$ Torr. The sputtering was continued until the platinum film thickness had approximately a 50% transmission for incident infrared radiation.

After sputtering, the photoresist was removed with acetone. This left a $300\mu$ metal dot, 21, (FIG. 6) on the complex semiconductor wafer. The photoresist was applied onto the platinum coated side of the wafer to form a coated area in the shape of a narrow annular ring, whose outer boundary was approximately $10\mu$ in from the edge of the deposited platinum.

Figure 4:
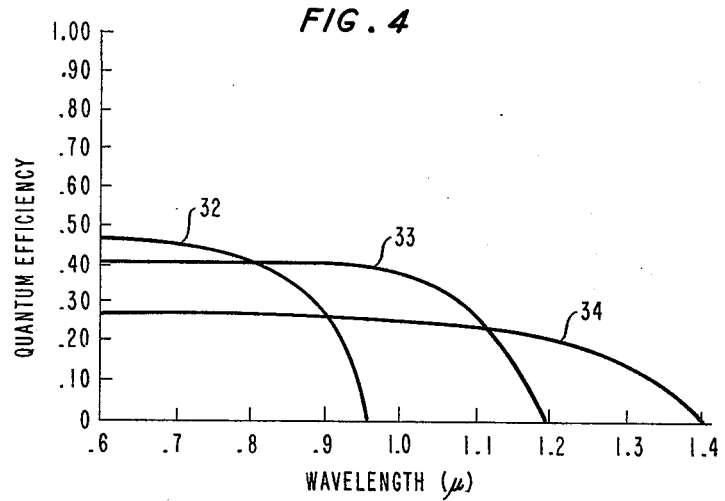
Figure 5:
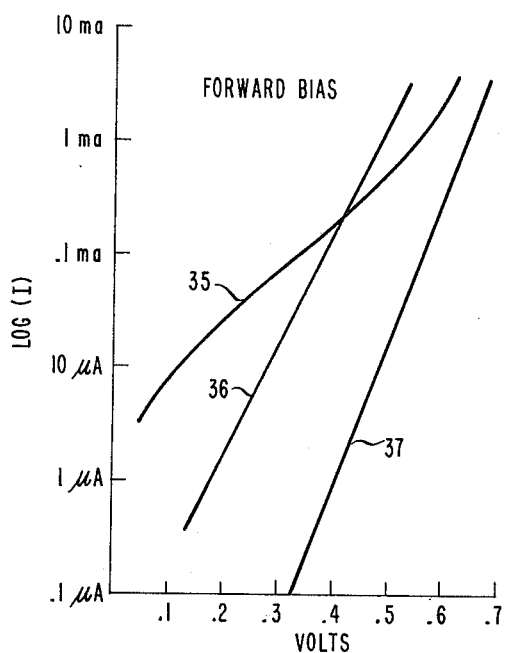
Figure 6:
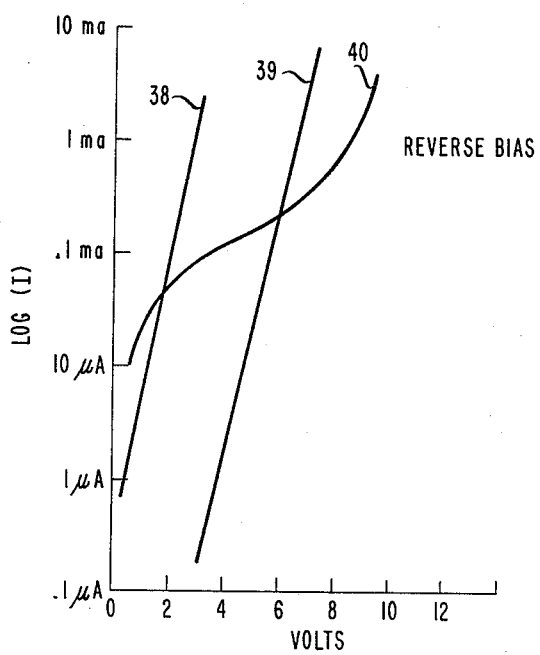

A layer of $SiO_2$, approximately 1800 Å thick was then sputtered onto the resist coated side of the wafer to form the areas 22, 23 and 24. This sputtering was done in an ion beam sputtering apparatus using the conditions of a beam current of 0.75 $ma/cm^2$, an accelerating potential of about 950 Volts, an Ar pressure for the beam in the range $1.5 \times 10^{-3}$ to $3.4 \times 10^{-2}$ Torr. A layer having a thickness in the range 1800 to 2000 Å was deposited. The resist was then removed with acetone. Another layer of photoresist was deposited so that it covered the $SiO_2$ areas 22, 23, and 24. An aluminum film was evaporated onto the resist treated portion of the wafer forming contact electrodes 25 and 26. The photoresist was then removed using acetone. The forward I-V characteristics, reverse I-V characteristics and wavelength response of the device is shown in FIGS. 5, 6 and 4 as 36, 38, and 33, respectively. A response curve of the diode was taken by illuminating the diode with monochromatic light obtained from a tungsten lamp used in conjunction with a grating spectrometer. The power spectrum of the monochromatic light from the spectrometer was measured with a bolometer. The absolute quantum efficiency at a wavelength of 6328 Å was measured using a He-Ne laser whose power at that wavelength was determined with a calibrated Eppley thermopile. The quantum efficiency of the diode was determined from these measurements to be about 40%.

EXAMPLE 2

A single bulk crystal of $InAs_{0.40}P_{0.60}$ was made by the gradient freeze technique of Example 1. The boat was initially loaded with approximately 35.32 grams of InAs, 34.694 grams of nominally undoped InP and 4.895 grams of Zn doped InP having a carrier concentration of approximately $3 \times 10^{18}$ $cm^{-3}$ and sealed in an ampule containing 0.87 grams of P, and 0.111 grams of As. A single crystal having dimensions of 60 mm. by 20 mm. with a majority carrier concentration of about $4 \times 10^{17}$ $cm^{-3}$ was obtained. This crystal and the polycrystalline remainder of the initially synthesized ingot were placed in a 5 inch long boron nitride boat. The boat was placed in a quartz ampule. Approximately 1.14 grams of P, and 0.149 grams of As were placed inside the ampule but not inside the boat. The ampule was then evacuated, sealed, and was fixed by a quartz rod 9, as shown in FIG. 2, in a zone melting apparatus. The apparatus consists of two furnaces 5 and 6 and a pair of glow bars 8 and 7. The glow bars are mounted as an integral unit which can be moved horizontally using a motor driven lead screw. The last to freeze portion of the crystal denoted 11 was positioned between the glow bars. The furnaces 5 and 6 were then heated to approximately 805 degrees C. and the glow bars were heated to a temperature sufficient to melt a 1 cm wide region of the crystal. The position of the ampule was then maintained and the furnaces with the glow bars were moved relative to the ampule at a rate of approximately 0.4 mm/hr. until the zone was moved through the entire ingot. The ampule was then removed from the furnace. The single crystal obtained after this treatment had a defect density as measured by the etchpit method of approximately $5 \times 10^4$ cm$^{-2}$. A Schottky barrier utilizing a Pt layer was then built on 20 1 mil. thick wafers cut from this crystal and treated by the method described in Example 1. The forward I-V characteristic, reverse I-V characteristic and wavelength response (cut-off at approximately 1.4 μm) are shown in FIGS. 5, 6, and 4 and denoted 35, 40, and 34, respectively. The quantum efficiency measured as described in Example 1 was 27%.

EXAMPLE 3

A bulk crystal $Ga_{0.05}In_{0.95}P_{0.80}As_{0.20}$ was grown by the gradient freeze method described in Example 1. The boron nitride boat was charged with 7.034 grams of GaAs, 18.483 grams of InAs, 27.755 grams of nominally undoped InP, 13.810 grams of Zn doped InP having a majority carrier concentration of approximately $3 \times 10^{18}$ cm$^{-3}$ and 16.48 grams of Zn doped InP having a majority carrier concentration of approximately $3 \times 10^{17}$ cm$^{-3}$ and the ampule with 2.126 grams of P, and 0.110 grams of As. The furnace was heated to 1072 degrees C. and cooled to 774 degrees C. as described in Example 1. A single crystal having dimensions 30 mm. by 20 mm. by 11 mm., a majority carrier concentration of $1.4 \times 10^{18}$ cm$^{-3}$, and a mobility of 27 cm$^2$/volt seconds was obtained. This crystal and the polycrystalline remainder of the initially synthesized ingot were placed in a boron nitride boat and inserted in another quartz ampule. Approximately 2.710 grams of P and 0.1375 grams of As were placed inside the ampule but not inside the boron nitride boat. The ampule was then evacuated and sealed. The ampule was then inserted and treated in the zone melting apparatus as described in Example 2, utilizing a furnace temperature of approximately 853 degrees C. and a furnace movement of approximately 0.5 mm/hr. The crystal obtained after the zone melting process was sliced into wafers having a thickness of approximately 20 mils. These wafers had a defect density as determined by the etchpit method of approximately $8 \times 10^4$ cm$^{-2}$. Schottky barriers employing Pt conducting layers were made as described in Example 1. The foward I-V characteristics, reverse I-V characteristics and the wavelength response (exhibiting a cutoff between approximately 0.8 and 0.9 μm) are shown in FIGS. 5, 6, and 4 and are denoted 37, 39, and 32, respectively. The quantum efficiency measured as described in Example 1 was between 45 and 47%.

We claim:

1. A device comprising a rectifying junction between a bulk crystal and an interfacing material characterized in that said bulk crystal has a composition of $Ga_xIn_{1-x}As_yP_{1-y}$ where $0 < x \leq 0.5$ and $0 < y < 1$, and has a defect density less than $10^6$ cm$^{-2}$ whereby current carriers are generated in said bulk crystal by infrared radiation.

2. The device of claim 1 wherein said interfacing material has metallic conductivity properties.

3. The device of claim 2 wherein said interfacing material comprises a highly conductive material chosen from the group consisting of Au and Pt.

4. The device of claim 1 wherein said interfacing material also has the composition $Ga_xIn_{1-x}As_yP_{1-y}$.

* * * * *

UNITED STATES PATENT AND TRADEMARK OFFICE
CERTIFICATE OF CORRECTION

PATENT NO. : 4,287,527
DATED : September 1, 1981
INVENTOR(S) : Klaus J. Bachmann and Charles T. Ryan It is certified that error appears in the above—identified patent and that said Letters Patent is hereby corrected as shown below:

Column 3, line 9, "ad" should read --and--.

Signed and Sealed this

Eighteenth Day of May 1982

[SEAL]

Attest:

Attesting Officer

GERALD J. MOSSINGHOFF

Commissioner of Patents and Trademarks